United States Patent
Suzuki et al.

(10) Patent No.: US 6,344,689 B1
(45) Date of Patent: Feb. 5, 2002

(54) OPTICAL SEMICONDUCTOR DEVICE FOR SURFACE MOUNTING

(75) Inventors: Nobuaki Suzuki; Masashi Sano; Shinichi Suzuki, all of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/680,444

(22) Filed: Oct. 6, 2000

(30) Foreign Application Priority Data

Oct. 7, 1999 (JP) .......................................... 11-287423

(51) Int. Cl.$^7$ .............................................. H01L 23/12
(52) U.S. Cl. ........................ 257/731; 257/668; 257/684; 257/728; 257/787
(58) Field of Search ................................. 257/731, 728, 257/684, 796, 678, 687, 787, 668, 730, 724

(56) References Cited

U.S. PATENT DOCUMENTS 6,242,801 B1 * 6/2001 Sano ........................... 257/731

FOREIGN PATENT DOCUMENTS

JP 06097510 A * 4/1994
JP 09232636 A * 9/1997

* cited by examiner

*Primary Examiner*—Nathan Flynn
*Assistant Examiner*—Remmon R. Fordé
(74) *Attorney, Agent, or Firm*—Morgan, Lewis & Bockius LLP

(57) ABSTRACT

An optical semiconductor device for surface mounting includes a semiconductor chip having a light emitting function or a light receiving function and two electrodes of the semiconductor chip sealed into a light-permeable resin package. The electrodes have tip surfaces externally exposed from the sides at the four corners of the resin package. The tip surfaces 4 of the electrodes are located on only the sides 4a of the resin package, but not located on the bottom thereof. In this configuration, when the optical semiconductor device for surface mounting is arranged on the solder paste on a board, its stand-up due to the contraction of the solder paste after the reflow can be avoided.

13 Claims, 3 Drawing Sheets

OPTICAL SEMICONDUCTOR DEVICE FOR SURFACE MOUNTING

BACKGROUND OF THE INVENTION

1. Field of the Invention

The present invention relates to an optical semiconductor device for surface mounting such as a sensor for surface mounting.

2. Description of the Related Art

An optical semiconductor device for surface mounting, e.g. a sensor for surface mounting has a structure in which a semiconductor chip having a light emitting function or a light receiving function and two electrodes of the semiconductor chip are sealed into a light-permeable resin package. The tips of these electrodes are exposed from the resin package so that they can be electrically connected to an external device.

FIG. 4 shows a conventional sensor for surface mounting. In FIG. 4, reference numeral 2 denotes a light-permeable resin package. Reference numeral 3 denotes a lens for converging the light emitted from a semiconductor chip or received light. Reference numeral 4 denotes the electrode of a semiconductor chip, i.e. electrode surfaces made of a metallic frame exposed from the outer surface of the resin package.

As shown in FIG. 5, in the conventional sensor for surface mounting, the exposed surfaces of the electrode are located e.g. on both side surfaces 4a at four corners of the square resin package 4a made of epoxy resin and on the bottom 4b thereof. The electrodes are electrically connected to a board via solder applied on the electrodes.

Where each sensor is mounted on the board 1 with the optical axis of the lens 3 being in parallel to the board surface, when the solder paste printed on the board 1 on which the sensor is located is applied to the electrode surfaces 4a and 4b of the semiconductor chip provided on the side surfaces and bottom of the resin package 2, a "Manhattan" phenomenon that the sensor stands up by 5–10° when the solder paste is hardened after the reflow often occurs (FIG. 4).

When the sensor stands up by 5° or more from a horizontal surface of printed circuit board, the optical axes of the paired opposite sensors become out of order. This deteriorates the sensor function, thereby making it impossible to use the sensors. Further, when stress is applied to the sensors in their floated-up state, the sensors easily fall from the board.

SUMMARY OF THE INVENTION

An object of the invention is to solve the problem related to the above conventional sensor for surface mounting. Specifically, the object of the invention is to provide a sensor for surface mounting which does not bring out a Manhattan phenomenon occurring and can be mounted on an accurately regulated area with an accurate orientation when solder paste is applied to the side and bottom of a resin package in a state where the sensor is located on the solder paste with its optical axis of a lens of the sensor being in parallel to the surface of the board.

The inventors of the invention has found that the above Manhattan phenomenon of the sensor is attributed to the fact that the solder paste contracts when it is hardened after the reflow, particularly, the solder paste applied to the bottom 4b of the resin package generates force of raising the resin package when it contracts. On the basis of this finding, in accordance with the invention, the electrode surfaces also extended on the bottom in a conventional resin package are located on only the sides of the resin package, thereby preventing the stand-up of the sensor. More specifically, the first invention provides a semiconductor device for surface mounting comprising a semiconductor chip having a light emitting function or a light receiving function and two electrodes of the semiconductor chip sealed into a light-permeable resin package, the electrodes having tip surfaces externally exposed from the sides at the four corners of the resin package, wherein the tip surfaces of the electrodes are located on only the sides of the resin package.

The present invention provides an optical semiconductor device for surface mounting comprising a semiconductor chip having a optical function and plurality of outer leads connected to electrodes of the semiconductor chip sealed into a light-permeable resin package, wherein said outer leads are externally exposed from the sides of the resin package, and at least one of said outer leads is located on only the sides of the resin package.

Preferably the device is a sensor for surface mounting.

Preferably said outer lead is formed so as to be fitted along the side being parallel with optical axis.

Preferably wherein said outer lead is exposed out of the along the side being parallel with optical axis and extend so as to be fitted along the side.

Preferably said optical semiconductor device is formed so as to be mounted on a circuit pattern of mount board in a manner that the side is contact with a surface of a mount board.

Preferably, wherein said outer lead is exposed out of the along the side being parallel with optical axis and extend so as to protrude from an end of the side of the resin package.

Preferably, said outer lead is formed on a surface of the resin package so as to prevent extending to a bottom surface of the resin package. In the above configuration, since the electrode surfaces of the semiconductor chip are not provided on the bottom of the resin package, when the optical semiconductor arranged on the solder paste on the board is subjected to reflow, it does not stand up. This realizes an product of the optical semiconductor device surface-mounted with a higher yield than a conventional optical semiconductor device.

DESCRIPTION OF THE PREFERRED EMBODIMENTS

Figure 1A:
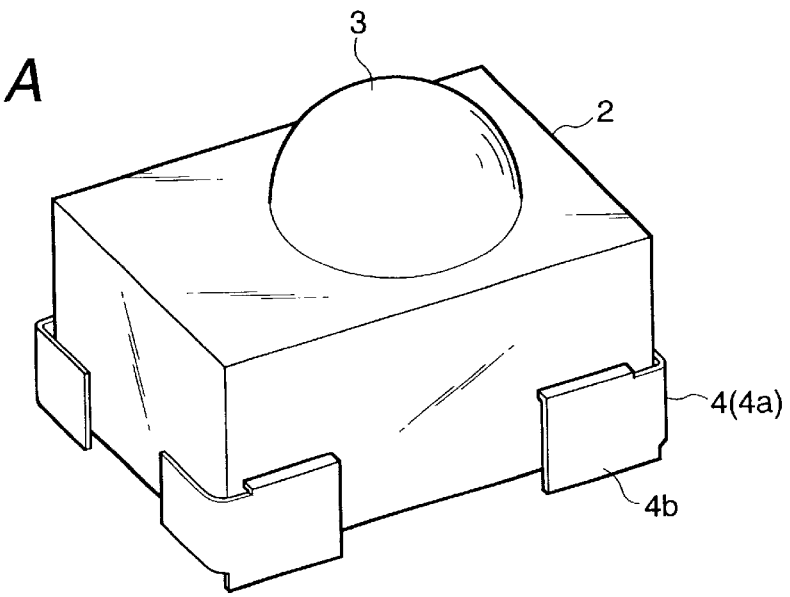
FIG. 1A is a perspective view of a semiconductor light-emitting device according to the invention.
Figure 1B:
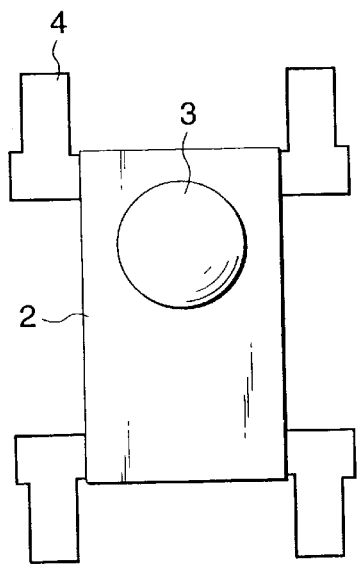
FIG. 1B is an upper view of a semiconductor light-emitting device according to the invention.

FIGS. 1A and 1B show a sensor for surface-mounting according to an embodiment of the invention. FIG. 1A is a perspective view of a semiconductor light-emitting device according to the invention. FIG. 1B is an upper view of a semiconductor light-emitting device prior to bending outer leads ( tip surfaces of these electrodes). It has a structure n which a semiconductor chip having a light emitting function or a light receiving function and two electrodes 4 of the semiconductor chip are sealed into a light-permeable resin package 2. The tip surfaces of these electrodes are exposed from the sides as an outer leads at the four corners of the resin package having a square shape so that they can be electrically connected to electrodes on a board. The electrode is formed as a lead frame. After mounting a semiconductor chip on a chip mount region of the lead frame and bonding the a semiconductor chip with the outer lead 4 (electrode surface) via bonding wire, the semiconductor chip is molded with the lead frame by the synthetic resin such as epoxy resin. And unrequired region of the lead frame is cut away and reduced outer lead is bent so as to fit along a side of the resin package.

Figure 2:
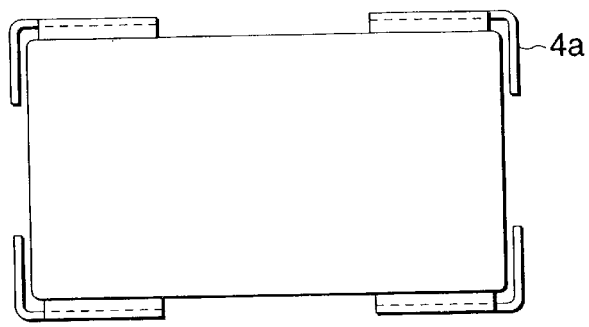
FIG. 2 is a bottom view of the semiconductor light-emitting device shown in FIG. 1.
Figure 3:
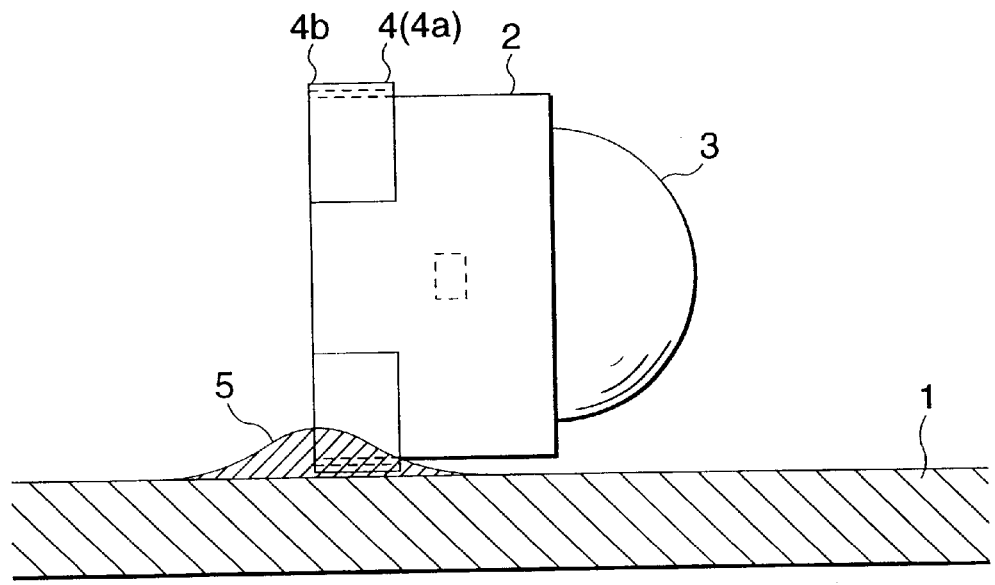
FIG. 3 is a view showing the state where the light-emitting device shown in FIG. 1 is soldered on a board.
Figure 4:
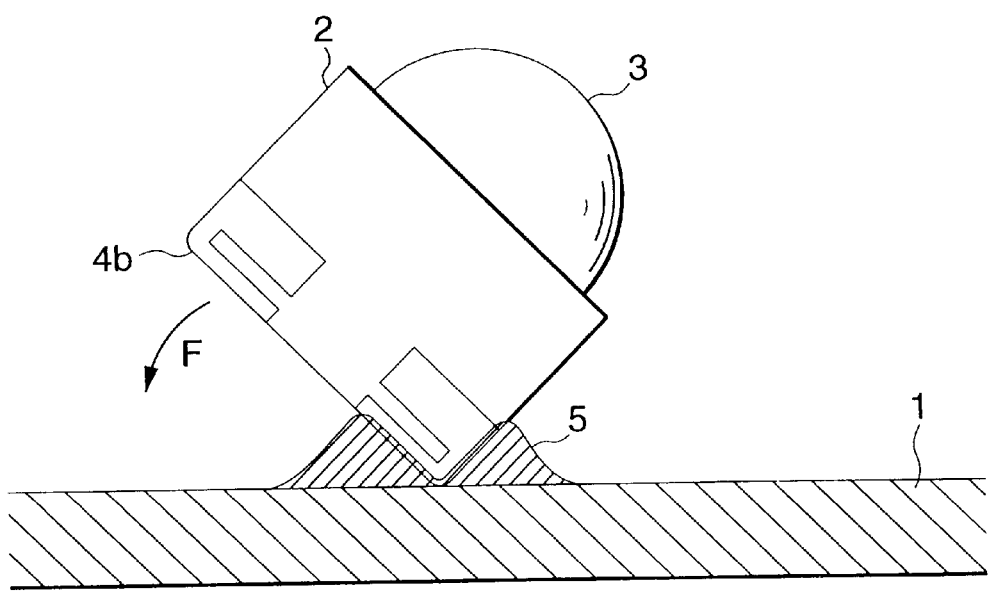
FIG. 4 is a view showing the state where a conventional light-emitting device is soldered on a board.
Figure 5:
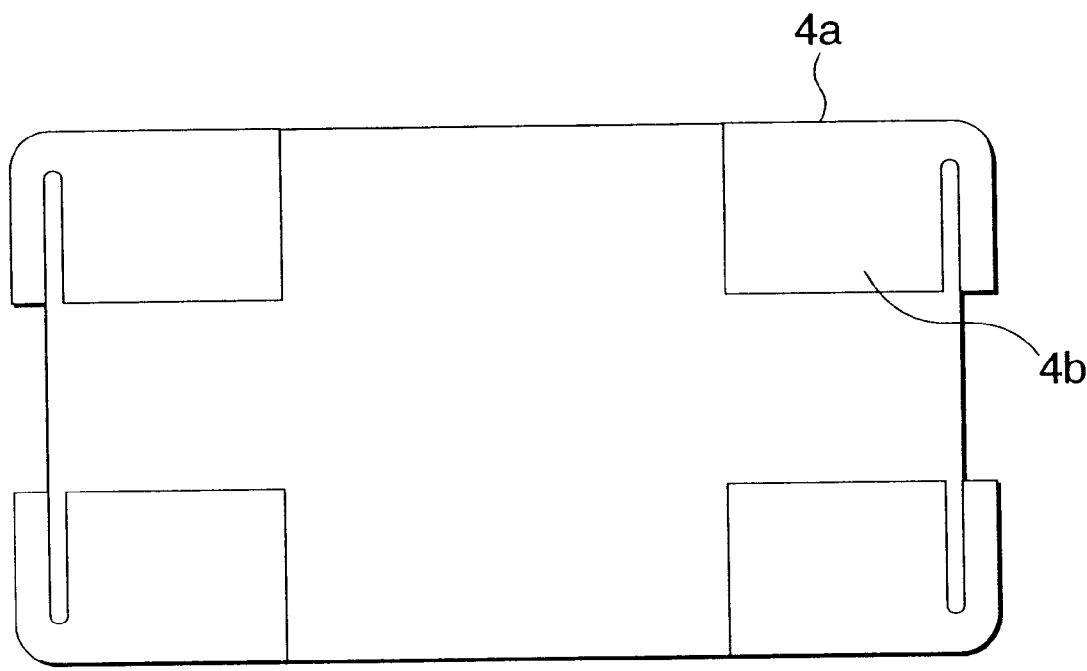
FIG. 5 is a bottom view of the conventional light-emitting device shown in FIG. 4.

FIG. 2 is a view viewed from the bottom of the sensor according to this embodiment. Unlike the conventional resin package, the electrodes are not located on the bottom. The portions indicated in dotted line denote the electrodes of the semiconductor chip.

In this way, the sensor according to this embodiment is not provided with the electrode faces on the bottom of the resin package. In addition, the solder paste cannot be applied to the synthetic resin such as epoxy resin. For these reasons, the contraction force when the solder paste is hardened and contracted after its reflow does not act in the direction of raising the sensor on the bottom of the resin package. Thus, when the sensor is arranged on the solder paste 5 located on the electrode of the board 1 so that the optical axis of the lens 3 made of the light permeable epoxy resin integrally formed with the resin package, is in parallel to the board 1, the Manhattan phenomenon does not occur after the reflow.

The simple structure according to the invention can solve the problem relative to the conventional optical semiconductor device for surface mounting.

What is claimed is:

1. An optical semiconductor device for surface mounting comprising a semiconductor chip having a optical function and plurality of outer leads connected to electrodes of the semiconductor chip sealed into a light-permeable resin package, wherein said outer leads are externally exposed from the sides of the resin package, and at least one of said outer leads is located on only the sides of the resin package.

2. An optical semiconductor device for surface mounting according to claim 1, wherein it is a sensor for surface mounting.

3. An optical semiconductor device for surface mounting according to claim 1, wherein said outer lead is formed so as to be fitted along the side being parallel with optical axis.

4. An optical semiconductor device for surface mounting according to claim 3, wherein said outer lead is exposed out of the along the side being parallel with optical axis and extend so as to be fitted along the side.

5. An optical semiconductor device for surface mounting according to claim 3, wherein said optical semiconductor device is formed so as to be mounted on a circuit pattern of mount board in a manner that the side is contact with a surface of a mount board.

6. An optical semiconductor device for surface mounting according to claim 3, wherein said outer lead is exposed out of the along the side being parallel with optical axis and extend so as to protrude from an end of the side of the resin package.

7. An optical semiconductor device for surface mounting according to claim 1, wherein said outer lead is formed on a surface of the resin package so as to prevent extending to a bottom surface of the resin package.

8. An optical semiconductor device to be surface mounted, comprising a semiconductor chip having a optical function and plurality of outer leads connected to electrodes of the semiconductor chip sealed into a light-permeable resin package, wherein said outer leads are externally exposed from side surfaces of the resin package, wherein at least one of said outer leads is located on only the side surfaces of the resin package, and wherein a side surface of the resin package is surface mounted.

9. An optical semiconductor device to be surface mounted according to claim 8, wherein it is a sensor for surface mounting.

10. An optical semiconductor device to be surface mounted according to claim 8, wherein said outer lead is formed so as to be fitted along the side being parallel with optical axis.

11. An optical semiconductor device to be surface mounted according to claim 10, wherein said outer lead is exposed out along the side being parallel with the optical axis and extend so as to be fitted along the side.

12. An optical semiconductor device to be surface mounted according to claim 10, wherein said outer lead is exposed out of the along the side being parallel with optical axis and extend so as to protrude from an end of the side of the resin package.

13. An optical semiconductor device to be surface mounted according to claim 8, wherein said outer lead is formed on a surface of the resin package so as to prevent extending to a bottom surface of the resin package.

* * * * *